(12) United States Patent
Williams et al.

(10) Patent No.: US 6,635,898 B2
(45) Date of Patent: Oct. 21, 2003

(54) QUANTUM COMPUTER

(75) Inventors: David Arfon Williams, Cambridge (GB); Paul Cain, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/988,195

(22) Filed: Nov. 19, 2001

(65) Prior Publication Data

US 2002/0190249 A1 Dec. 19, 2002

(30) Foreign Application Priority Data

May 30, 2001 (EP) ............................................. 01304745

(51) Int. Cl.$^7$ ................................................. H01L 29/06
(52) U.S. Cl. ............................................ 257/14; 257/25
(58) Field of Search ................................. 257/14, 25, 23, 257/27, 29, 30

(56) References Cited

U.S. PATENT DOCUMENTS 5,889,288 A * 3/1999 Futatsugi ..................... 257/20
6,323,504 B1 * 11/2001 Shin et al. ..................... 257/14

FOREIGN PATENT DOCUMENTS

WO 0036561 6/2000

OTHER PUBLICATIONS

P. Cain, et al "Hole Transport Through Single and Double SiGe Quantun Dots", Applied Physics Letters, Nov. 20, 2000, AIP, USA, vol. 77, No. 21, pp. 3415–3417.

T. Oosterkamp, et al "Microwave Spectroscopy of a Quantum–Dot Molecule", NATURE, Oct. 29, 1998, MacMill an Magazines, UK, vol. 395, No. 6705, pp. 873–876.

G. Burkard et al, "Coupled Quantum Dots as Quantum Gates", Physical Review, B. Condensed Matter, American Institute of Physics, New York, vol. 59, No. 3, Part 1, Jan. 15, 1999, pp. 2070–2078.

J. Kotthaus, Jr. et al., "Electronic Interactions Between Quantum Dots", Physica B. Condensed Matter, vol. 227, No. 1/4 1996, pp. 1–5.

* cited by examiner

*Primary Examiner*—Sara Crane
(74) *Attorney, Agent, or Firm*—Antonelli, Terry, Stout & Kraus, LLP

(57) ABSTRACT

A quantum computer comprises a trench-isolated channel region formed in a boron-doped silicon germanium layer which has narrow channel regions which form tunnel barriers and wide channel regions which define first and second quantum dots. Tunnelling between the first and second quantum dots is controlled by a side gate and/or a surface gate. The quantum states used to represent a qubit may be defined as |an excess hole on the first quantum dot> and |an excess hole on the second quantum dot>. A Hadamard Transformation $U_H$ of an initial state may be effected by application of a pulse to the side or surface gate. The first and second tunnel quantum dots are of unequal size which helps decouple the quantum computer from the environment.

38 Claims, 9 Drawing Sheets

QUANTUM COMPUTER

FIELD OF THE INVENTION

The present invention relates to a quantum computer.

BACKGROUND ART

Quantum information processing covers a variety of fields where quantum mechanical effects are used to process information in applications such as computation and communications. An introduction to this subject is found in "Introduction to Quantum Computation and Information" ed. Hoi-Kwong Lo, Tim Spiller and Sandu Popescu (World Scientific Publishing, 1998).

Quantum computation involves manipulation of data in form of quantum bits or "qubits". Whereas in classical computation a bit of information is used to represent only one of two possible logical states, namely "1" or "0", in quantum computation, a qubit can represent both logical states simultaneously as a superposition of quantum states. This property gives rise to powerful computational parallelism. Algorithms which exploit this parallelism have been developed, for example, for efficiently factorising large integers. An overview of quantum computing is found in "Quantum Computation" by David Deutsh and Artur Ekert in Physics World, pp. 47–52, March 1998 and in "Quantum Computation: An Introduction" by Adriano Barenco, pp. 143–183 of "Introduction to Quantum Computation and Information" ibid.

In known systems, a qubit is stored using left and right polarisation states of a photon, spin-up and spin-down states of an electron and ground and excited states of a quantum dot.

The qubit is defined by a basis consisting of two states, which are denoted $|0>$ and $|1>$. Thus, the state of the qubit can be represented as:

$$|\psi>=a|0>+b|1>$$

where a and b are complex number coefficients. The qubit can store information as a combination of 0 and 1, using different values of a and b. However, a measurement of the qubit will cause it to project onto $|0>$ or $|1>$ state and return the result 0 or 1 respectively. The probabilities of returning these values are $|a|^2$ and $|b|^2$ respectively. In this way, a system comprised of one qubit can store two binary values, 0 and 1, at the same time, although recovery of any stored information is restricted.

A system comprised of two qubits can store up to four binary values simultaneously as a result of superposition. A system comprising a pair of qubits, labelled A and B, is defined by a basis of four states which can be written as $|0>_A|0>_B$, $|0>_A|1>_B$, $|1>_A|0>_B$ and $|1>_A|1>_B$. In the same way a single qubit can store information as a superposition of $|0>$ and $|1>$, a pair of qubits can store information as a superposition of the basis states $|0>_A|0>_B$, $|0>_A|1>_B$, $|1>_A|0>_B$ and $|1>_A|1>_B$. For example, the two qubits may be prepared such that:

$$|\psi>_{AB}=2^{-\frac{1}{2}}(|0>_A|0>_B+|0>_A|1>_B+|1>_A|0>_B+|1>_A|1>_B)$$

Thus, four binary values 00, 01, 10 and 11 are encoded simultaneously. In this case, the two qubits exist independently of one another, such that the result of a measurement of qubit A is independent of the result of a measurement of qubit B.

However, if the two qubits are entangled, then the two measurements will become correlated. Entanglement allows qubits to be prepared such that:

$$|\psi>_{AB}=2^{-\frac{1}{2}}(|0>_A|0>_B+|1>_A|1>_B)$$

Thus, binary values 00 and 11 are encoded simultaneously. However, if qubit A is measured and a result 0 is returned, then the outcome of a subsequent measurement of qubit B will, with certainty, also be 0.

A system comprised of three qubits is defined by a basis of eight states which can store eight binary numbers, 000, 001, . . . , 111 simultaneously.

In general, a system of m qubits has a basis of $2^m$ states and can be used to represent numbers from 0 to $2^m-1$. Thus, a quantum computer has a clear advantage over its classical counterpart in that it that it can store $2^m$ numbers simultaneously, whereas a classical computer with an m-bit input register can only store one of these numbers at a time.

It is the ability to store many numbers simultaneously using superposition of quantum states which makes quantum parallel processing possible. Using a single computational step it is possible to perform the same mathematical operation on $2^m$ different numbers at the same time and produce a superposition of corresponding output states. To achieve the same result in a classical computer, the computational step would need to be repeated $2^m$ times or require $2^m$ different processors.

Despite the power of quantum parallel processing, there is a drawback that only one state can be measured. However, some processes, such as sorting or searching a database, may require only a single-valued solution. Thus, a system in which a mathematical operation has been performed on a plurality of numbers simultaneously may still benefit from parallelism provided that the desired value is the most probable outcome when the system is measured. An example of a quantum algorithm which operates in this way is described in "A Fast Quantum Mechanical Algorithm for Database Search" by Lov Grover, pp. 212–219, Proceedings of the 28$^{th}$ Annual ACM Symposium on the Theory of Computing (Philadelphia, May 1996).

So far, experimental quantum computers have been implemented using atomic beams, trapped ions and bulk nuclear magnetic resonance. Examples of these systems are described in "Quantum computers, Error-Correction and Networking: Quantum Optical approaches" by Thomas Pellizari, pp. 270–310 and "Quantum Computation with Nuclear Magnetic Resonance" by Isaac Chuang pp. 311–339 of "Introduction to Quantum Computation and Information" ibid. However, these systems have the disadvantage that their architecture cannot be easily scaled to accommodate large number of qubits, i.e. more than about 10 qubits.

Quantum computers may also be implemented using solid-state systems employing semiconductor nanostructures and Josephson junctions. One such device is described in "Coherent control of macroscopic quantum states in a single-Cooper-pair box" by Y. Nakamura, Yu. A. Pashkin and J. S. Tsai, Nature, volume 398, p 786 (1999). The advantage of such solid state systems is that they ate better suited to being scaled and so provide quantum computers of practical utility.

A generally recognised problem is that quantum computation, and indeed any systems involving sensitive information processing, requires a quiet electromagnetic environment to operate. If the system interacts with the environment, then it loses coherence and quantum parallelism is destroyed.

The present invention seeks to provide a quantum computer and a device for providing a quiet electromagnetic environment.

SUMMARY OF THE INVENTION

According to a first aspect of the present invention there is provided a quantum computer for transforming a first state into a second state comprising a first quantum dot, a second quantum dot, said first and second quantum dots being spaced apart and arranged so as to define first and second basis states of a quantum bit, gate electrodes for preparing said first state as a superposition of said first and second basis states and gate electrodes for controlling coupling between said first and second quantum dots so as to transform said first state into said second state.

The first basis state may be defined by a first given charge distribution across said first and second quantum dots and the second basis state may be defined by a second given charge distribution across said first and second quantum dots.

The first basis state may be defined by a given amount of excess charge on said first quantum dot relative to said second quantum dot and the second basis state may be defined by a given amount of excess charge on said second quantum dot with respect to said first quantum dot.

The gate electrodes for controlling coupling between said first and second quantum dots may comprise an electrode for adjusting a tunnel barrier disposed between said first and second quantum dots.

The first and the second quantum dots may be of unequal size.

The quantum computer may comprise a conductive channel region between source and drain regions. The conductive channel region may be substantially planar.

A first portion of the conductive channel region may be configured so as to define a first tunnel barrier and a second portion of the conductive channel region may be configured so as to define a second tunnel barrier. A third portion of the conductive channel region may be configured so as to define a second tunnel barrier. The conductive channel region may comprise a semiconductor, such as silicon-germanium. The semiconductor may be doped with an impurity and the impurity concentration may be at least $1 \times 10^{19}$ cm$^{-3}$. The impurity can be an acceptor, such as boron.

The conductive channel region may be isolated by at least one trench.

The first and second quantum dots may be configured so as to exhibit Coulomb blockade.

The quantum computer may comprise a sensor for measuring charge on at least one of said first and second quantum dots or sensors for measuring charge on each of said first and second quantum dots. The sensor for measuring charge may comprise a single-electron electrometer.

According to a second aspect of the present invention there is provided a quantum computer for transforming a first state into a second state comprising an array of elements, each element of the array comprising: a first quantum dot, a second quantum dot, said first and second quantum dots being spaced apart and arranged so as to define first and second basis states of a quantum bit, gate electrodes for preparing a quantum bit state as a superposition of said first and second basis states, said elements being arranged so as to cause entanglement of the quantum bits of said elements of said array, gate electrodes for preparing said first state as an entangled superposition of quantum bit states and gate electrodes for controlling coupling between first and second quantum dots of at least one element so as to transform said first state into said second state.

According to the present invention there is also provided apparatus including a quantum computer and a source for providing a time dependant electric field to said quantum computer. The source can be a laser, a gate electrode or a source which generates microwaves.

According to the present invention there is also provided apparatus including a quantum computer and control circuitry for controlling said gate electrodes.

According to the present invention there is also provided apparatus including a quantum computer and a refrigerator for cooling said quantum computer.

According to a third aspect of the present invention there is provided a method of operating a quantum computer comprising a first quantum dot, a second quantum dot, said first and second quantum dots being spaced apart and arranged so as to define first and second basis states, the method comprising preparing a first state as a superposition of said first and second basis states and controlling coupling between said first and second quantum dots so as to transform said first state into a second state.

The controlling of the coupling between said first and second quantum dots may comprise lowering a tunnel junction disposed between said first and second quantum dots for a predetermined period of time.

The method may comprise providing an excitation so as to cause Rabi oscillations between said first and second states.

According to a fifth aspect of the present invention there is provided a quantum computer for transforming a first state into a second state comprising a structure for defining a first quantum dot, a structure for defining a second quantum dot, said structures for defining said first and second quantum dots being spaced apart and arranged so as to define first and second basis states of a quantum bit, gate electrodes for preparing said first state as a superposition of said first and second basis states and gate electrodes for controlling coupling between said first and second quantum dots so as to transform said first state into said second state.

According to a fifth aspect of the present invention there is provided an electronic device comprising a channel for charge carriers, a source for providing charge carriers to said channel with a first range of charge carrier energy, said channel comprising a first quantum dot with a first set of energy levels, a second quantum dot with a second set of energy levels having different level spacing from the first set, wherein the first range of charge carrier energy is greater than the spacing between a pair of adjacent energy levels of the first quantum dot and that charge carrier transport through the device only takes place through a one of the first set of energy levels and a one of the second set of energy levels which are energetically aligned.

BRIEF DESCRIPTION OF THE DRAWINGS

Embodiments of the present invention will now be described, by way of example, with reference to the accompanying drawings in which.

PREFERRED EMBODIMENTS OF THE INVENTION

Coupled Quantum Dot Device

Figure 1:
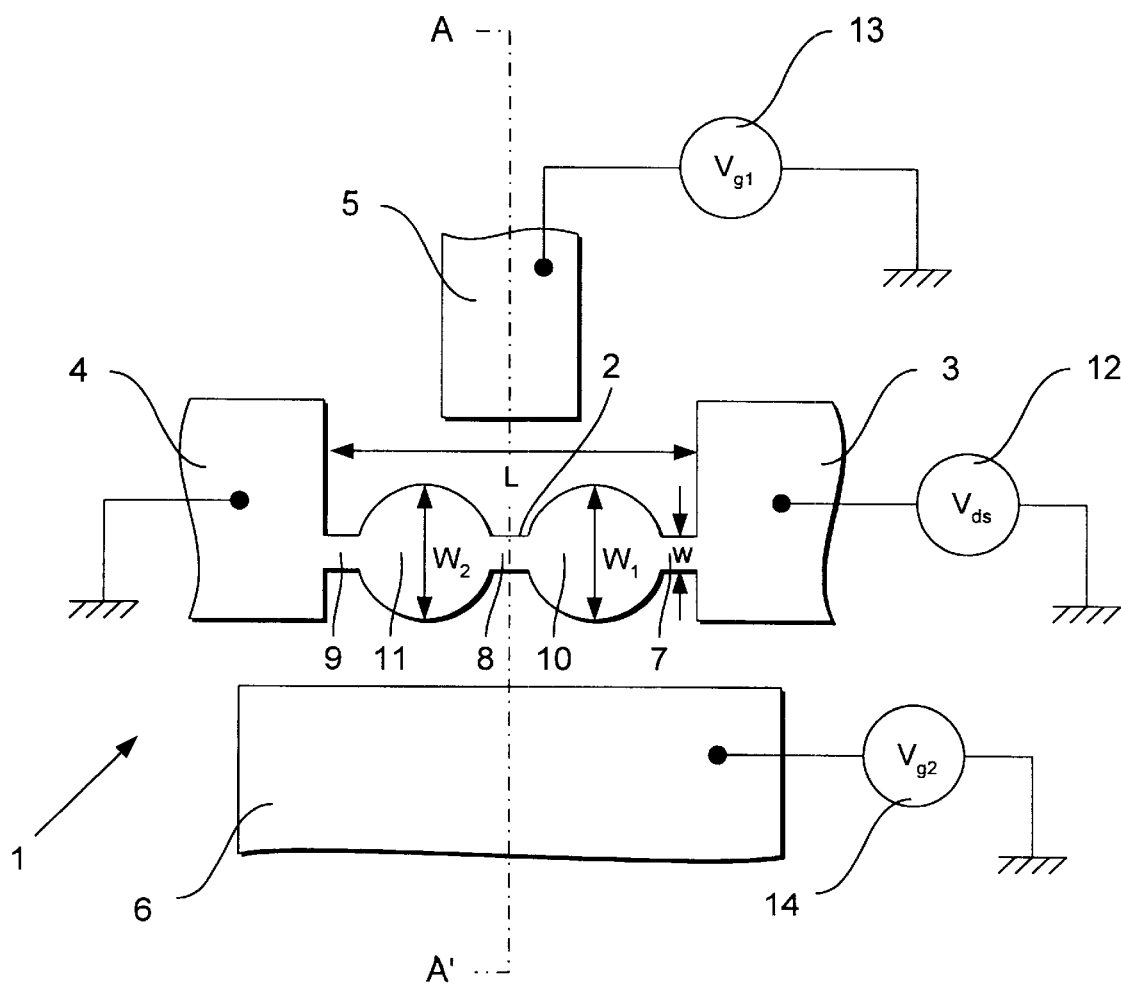
FIG. 1 is a plan view of a first coupled quantum dot device.

Referring to FIG. 1, a coupled quantum dot device 1 has a trench-isolated channel region 2 disposed between source 3 and drain regions 4 and is provided with first and second side gate regions 5, 6 either side of the channel region 2. The channel region 2 is "pinched" so as to produce first, second and third narrow channel regions 7, 8, 9. A first wide channel region 10 is formed between the first and second narrow regions 7, 8 and a second channel wide region 11 is defined between the second and third narrow regions 8, 9. The channel region 2 is about 200 nm long between the source and drain regions 3, 4 and is indicated by an arrow L. The relatively narrow channel regions 7, 8, 9 are 20 nm wide as indicated by an arrow w. The first and second wide regions 10, 11 are substantially circular and have diameters of about 60 nm as indicated by arrows $W_1$ and $W_2$. However, their diameters are not quite equal. Preferably, $W_1 < W_2 < 1.01 W_1$ or vice versa.

In the longitudinal direction of the channel 2, the first and second gate regions 5, 6 are 100 nm and 400 nm long respectively. In the transverse direction, each gate region 5, 6 is separated from the wide channel regions 10, 11 by 100 nm.

A first voltage source 12 is used to apply a bias $V_{ds}$ between the source and drain regions 3, 4. Second and third voltage sources 13, 14 are used to apply gate biases $V_{g1}$, $V_{g2}$ to the first and second gate regions 5, 6. The drain region 4 is grounded.

Figure 2:
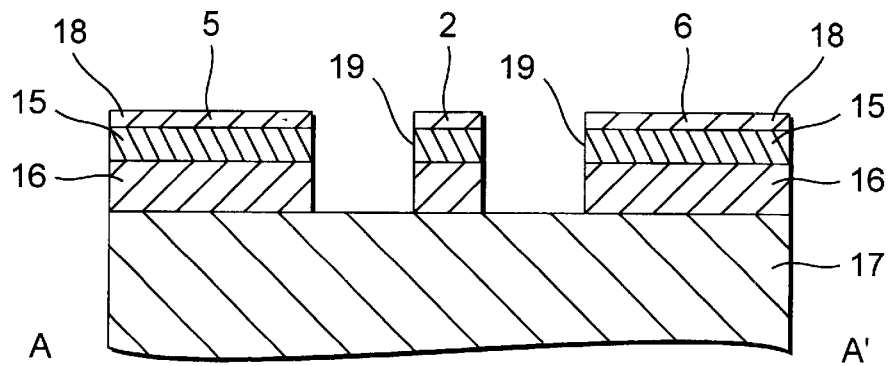
FIG. 2 is a cross sectional view taken along the line A–A' in FIG. 1.

Referring to FIG. 2, the channel, source, drain and gates regions 2, 3, 4, 5, 6 are formed by layers of silicon-germanium 15 which overlie layers 16 comprising intrinsic silicon disposed on an insulating silicon dioxide substrate 17. Capping layers 18 comprising intrinsic silicon are provided on the silicon-germanium layers 15. The silicon-germanium layers 15 comprise $Si_{0.9}Ge_{0.1}$ doped with boron to a concentration of $1 \times 10^{19}$ cm$^{-3}$. The silicon-germanium layers 15 have a thickness of 30 nm. The capping and underlying silicon layers 18, 16 have thicknesses of 5 nm and 40 nm respectively. The lateral extent of the silicon-germanium, capping and underlying layers 15, 16, 18 are delimited by sidewalls 19. A method of fabricating the device 1 will be described later.

Figure 3:
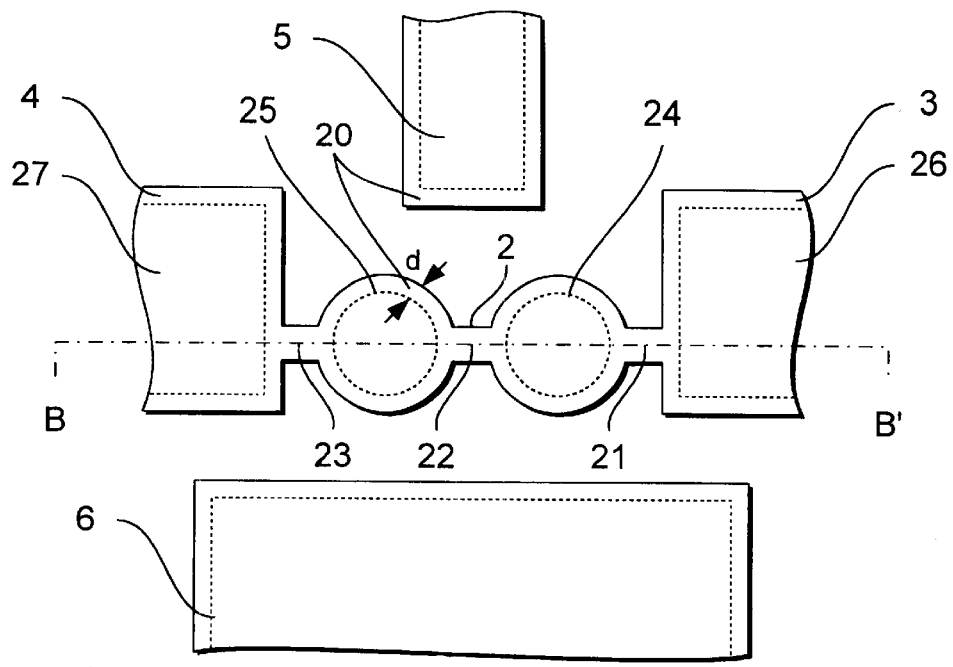
FIG. 3 is a plan view of the first device indicating the effect of depletion.

Referring to FIG. 3, depletion regions 20 penetrate laterally from the sidewalls 19 into the silicon-germanium layer 15 by 10 nm, i.e. d=10 nm. This causes the narrow channel regions 7, 8, 9 to become fully depleted, thus forming first, second and third tunnel barriers 21, 22, 23 which isolate the wide channel regions 10, 11 from the source and drain regions 3, 4 and from each other. Under these conditions, first and second quantum dots 24, 25 are formed within the first and second wide regions 10, 11 respectively. The source and drain regions 3, 4 define a source 26 and a drain 27.

Figure 4:
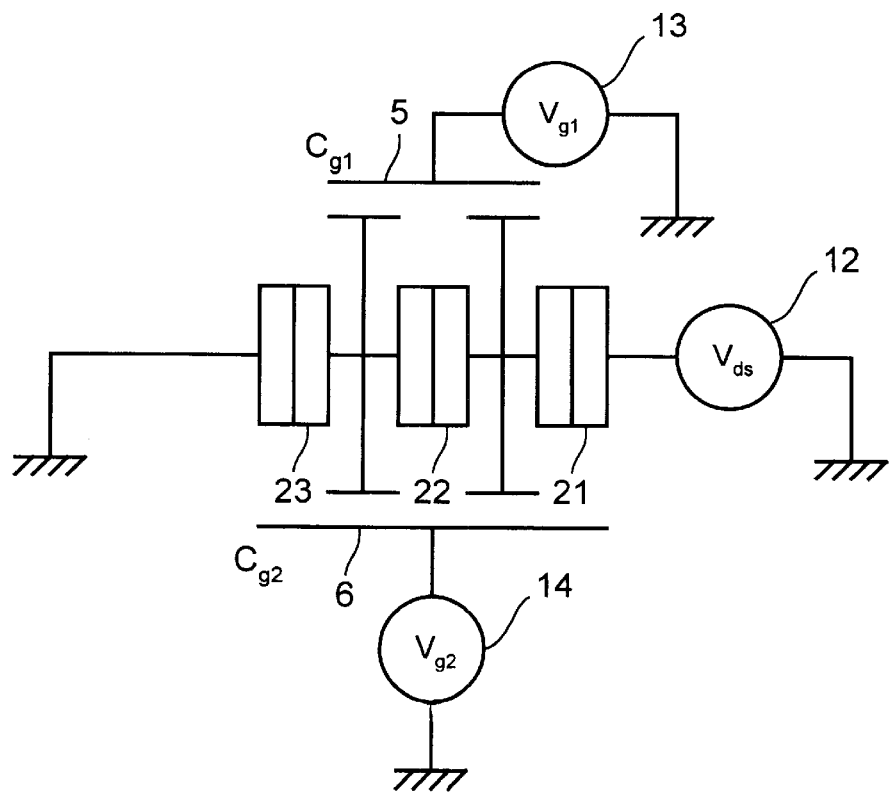
FIG. 4 is an equivalent circuit of the first device.

Referring to FIG. 4, an equivalent circuit of the device 1 is shown which includes the first, second and third tunnel barriers 21, 22, 23 and the first and second gates 5, 6. First and second effective gate capacitances $C_{g1}$, $C_{g2}$ associated with the first and second gates 5, 6 are shown.

Figure 5:
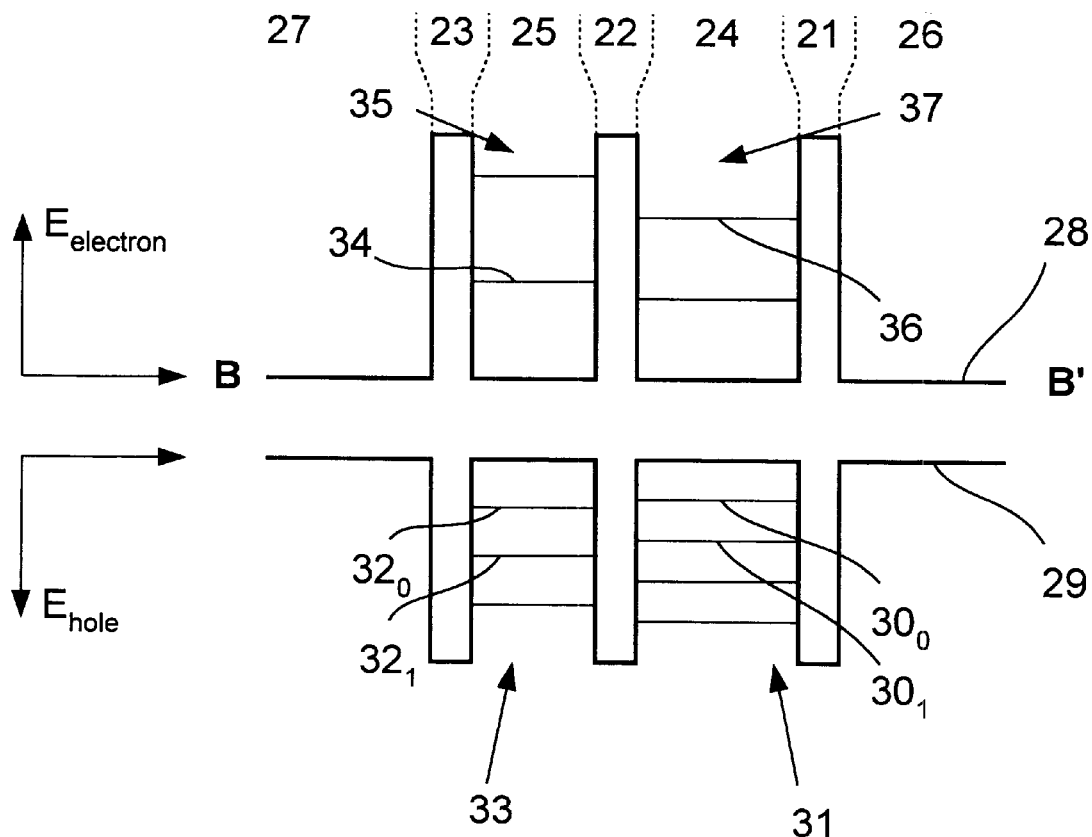
FIG. 5 shows an energy band diagram taken along the line B–B' in FIG. 3.

Referring to FIG. 5, a band energy diagram shows conduction and valance band edges 28, 29 for the coupled quantum dot device 1. A first set of quasi-bound states 30 form in a first quantum well 31 defined by the valance band edge 29. Similarly a second set of quasi-bound sates 32 form in a second quantum well 33 defined by the valance band edge 29. Likewise, third and fourth sets 34, 36 of states form in quantum wells 35, 37 by the conduction band edge 28.

The first and second quantum dots 24, 25 have slightly different sizes and consequently the widths of the first and third quantum wells 31, 37 differ from those of the second and third quantum wells 33, 35. Therefore, the energy spacing of the first set of quantum states 30 differs from the energy spacing of second set of quantum states 32. For example, the energy spacing between a lowest state $30_0$ and a next lowest state $30_1$ in the first quantum well 31 varies from the energy spacing between a lowest state $32_0$ and a next lowest state $32_1$ in the second quantum well 33.

The electrical properties of device 1 are dominated by hole, as opposed to electron, transport because boron-doped silicon-germanium is used. Therefore, the following description is limited to hole transport within the valance band. Nevertheless, it will be appreciated the underlying principles apply equally to devices in which electrons are the majority charge-carrier type.

The device 1 shown in FIG. 1 is arranged to exhibit Coulomb blockade effects. The first and second quantum dots 24, 25 behave as isolated conductive islands and so charge flow between the source 26 and drain 27 is subject to Coulomb blockade.

Figure 6:
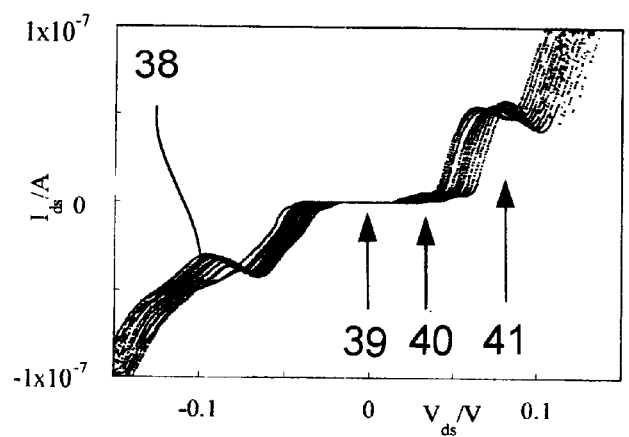
FIG. 6 is a plot of source-drain current against voltage for the first device at different side gate voltages.
Figure 7:
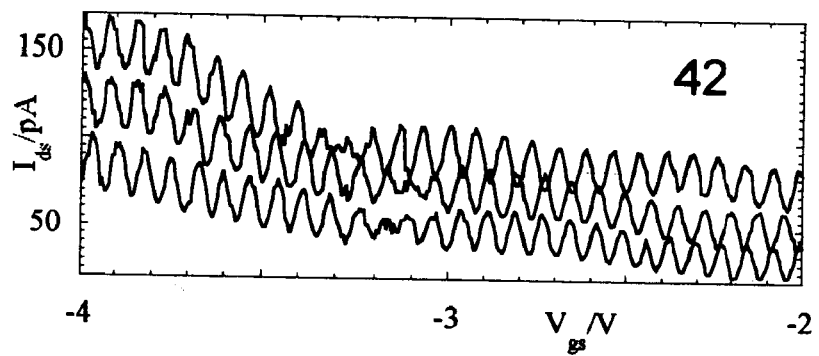
FIG. 7 is a plot of source-drain current against gate voltage for the first device.
Figure 8:
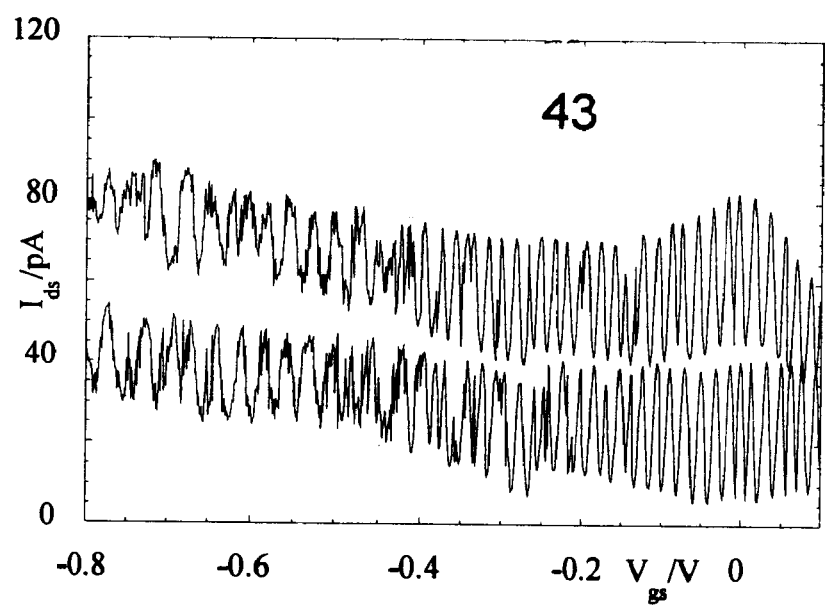
FIG. 8 is another plot of source-drain current against gate voltage for the first device.

Referring to FIGS. 6 to 8, the electrical characteristics of the device 1 will now be described.

In FIG. 6, a set of current-voltage characteristics ($I_{ds}$-$V_{ds}$) 38 between the source 3 and the drain 4 are shown. The characteristics 38 are measured with the device 1 cooled to 4.2 K with biases applied to the second side gate 6 ranging between −1V to 0V in 0.1V steps, i.e. $-1V \leq V_{g2} \leq 0V$.

The characteristics 38 show a Coulomb gap 39, where current flow is suppressed, for $|V_{ds}| < 30$ mV. The characteristics 38 exhibit Coulomb staircases 40 at higher biases. The Coulomb staircases 40 are used to estimate the total capacitance $C_\Sigma$ of the device, wherein $C_\Sigma = e/V_{gap} = 11$ aF. The characteristics 38 also show regions of negative differential conductance 41 which is attributable to resonant tunnelling between the quasi-bound states 30, 32 of the quantum dots 24, 25.

In FIG. 7, a set of current against first gate voltage characteristics ($I_{ds}$-$V_{g1}$) 42 are shown for the device 1 cooled to 4.2 K. The characteristics 42 are measured with the source-drain voltage held at 900 µV, 700 µV and 600 µV, i.e. $V_{ds}$=900 µV, 700 µV and 600 µV and the second gate 6 grounded. Conductance oscillations are observed when the second voltage source 13 (FIG. 1) applies a negative applied voltage. The oscillations have a period ($\Delta V_{g1}$) of 7 mV. From this, the first effective gate capacitance, $C_{g1}$ (FIG. 4) is calculated, such that $C_{g1}$=e/$\Delta V_{g1}$=2.3 aF.

In FIG. 8, a set of current against second gate voltage characteristics ($I_{ds}$-$V_{g2}$) 43 are shown for the device 1 cooled to 4.2 K. In this case, the first gate 5 is grounded. If the third voltage source 14 (FIG. 1) applies a second gate bias which is more positive than −0.4 V, i.e. $V_{g2}$>−0.4 V, conductance oscillations are observed with a period ($\Delta V_{g2}$) of 17 mV. From this value, the second gate capacitance, $C_{g2}$ (FIG. 4) is calculated, wherein $C_{g2}$=e/$\Delta V_{g2}$=9.4 aF. If the third voltage source 14 applies a second gate bias which is more negative than −0.4V, i.e. $V_{g2}$<−0.4 V, the period of the conductance oscillations doubles and the second gate capacitance. $C_{g2}$ is halved, such that $C_{g2}$=4.8 aF. Moreover, the level of noise on the signal shown in the characteristic 43 increases as the oscillation period doubles.

The response of the device 1 may be understood in the following way:

At the more positive gate biases, i.e. $V_{g2}$22 −0.4 V, two quantum dots are defined, namely the first and second quantum dots 24, 25 as shown in FIG. 3. As the gate bias is made more negative, i.e. $V_{g2}$<−0.4 V, progressively more holes are induced in the narrow channel regions 7, 8, 9, until one of the narrow channel regions 7, 8, 9 begins to conduct. The conducting narrow region 7, 8, 9 no longer forms an insulating tunnel barrier. With only two tunnel barriers, only one quantum dot is defined.

Figure 9A:
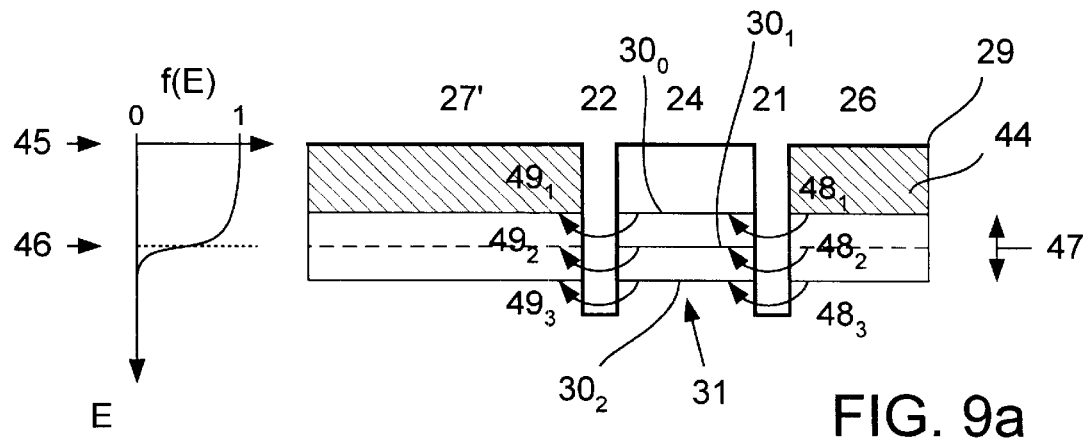
FIG. 9a shows a valance band energy diagram for the first device when a large gate bias is applied and only one quantum dot is defined.

Referring to FIG. 9a, a band energy diagram shows the situation where only one quantum dot is defined. For the purposes of illustration, the third narrow region 9 turns conductive when the second gate 6 is made more negative. Thus, a modified drain 27' is formed which extends into the second wide channel region 11 and only the first quantum dot 24 remains defined. Transport from the source 26 to the modified drain 27' takes place through the quasi-bound energy levels 30 formed by the first quantum well 31. Holes 44 occupy the source 26 with a range of energies (E) according to the Fermi-Dirac distribution, $f_{FD}$(E), starting from the valance band edge 45. At absolute zero (T=0 K), all hole energy states in the source 26 are occupied, i.e. $f_{FD}$(E)=1, up to a Fermi energy level ($E_F$) 46. However, at non-zero temperature, there is an energy spread 47 about the Fermi energy level ($E_F$) 46 caused by thermal broadening equal to several times the value of $k_B$T, where $k_B$ is Boltzman's constant and T is temperature. At 4.2 K, the energy spread 47 is few millielectron volts. This energy spread 47 occurs in both the source 26 and the modified drain 27'. In device 1, the first set of energy levels 30 are separated by about 1 meV, which is smaller than the spread of hole energies 47. Therefore, hole transport takes place through a plurality of levels 30 of the first quantum dot 24 simultaneously. Holes tunnel onto the first quantum dot 24 by first, second and third allowed transitions $48_1$, $48_2$, $48_3$ and off into the modified drain 27' by fourth, fifth and sixth allowed transitions $49_1$, $49_2$, $49_3$.

Thus, if a large negative gate bias is applied, i.e. $V_{g2}$>−0.4 V, then only one quantum dot is defined and multiple channels are available to conduct holes 44 through the device 1. In the example illustrated in FIG. 9a, three conduction channels are available as represented by pairs of transitions $48_1$, $49_1$, $48_2$, $49_2$, $48_3$, $49_3$. Therefore, holes 44 with a range of energies corresponding to the spread in energy 47 caused by thermal broadening are allowed to pass through the device 1. Current flow through multiple channels is inherently more noisy than current flow through a single channel. Furthermore it is more difficult to control since as the gate bias is varied, a channel may close and then open, leading to sudden jumps in current.

Figure 9B:
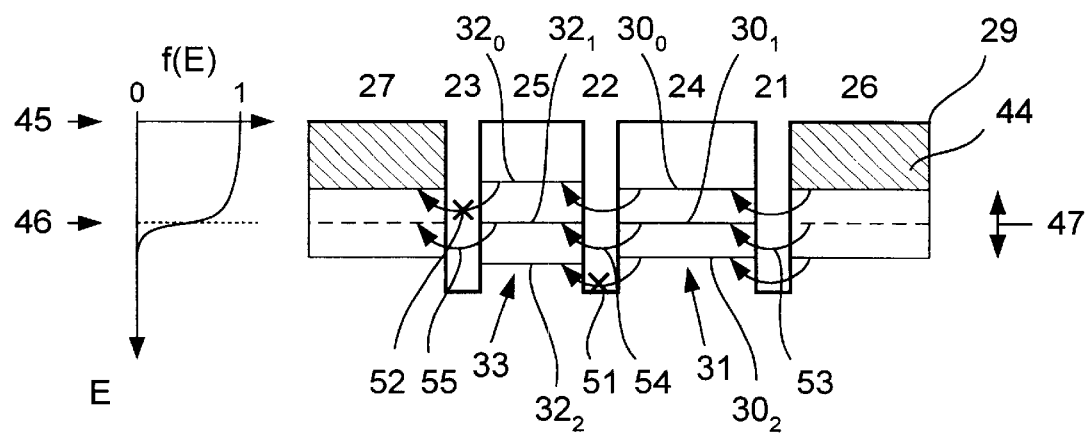
FIG. 9b shows a valance band energy diagram for the first device when two quantum dots are defined.

Referring to FIG. 9b, a band energy diagram 50 shows the situation where both quantum dots are defined. As in the single dot case, holes occupy the source and drain 26, 27 according to the Fermi-Dirac distribution, $f_{FD}$(E) and thermal broadening causes the spread 47 in hole energies about the Fermi level 46.

If both the first and second quantum dots 24, 25 are defined, transport from the source 26 to the drain 27 takes place through the quasi-bound energy levels 30, 32 formed by the first and second quantum wells 31, 33 and must satisfy energy level restrictions for both dots 24, 25 in series. As described earlier, the energy spacing of the first and second set of quasi-bound states 30, 32 differ. Thus, at most, only one energy level, for example the next lowest level $30_1$ of the first set 30 may become aligned with another energy level, for example the next lowest level $32_1$ of the second set 32 in the vicinity of the Fermi level ($E_F$) at any given bias. If there are very few quasi-bound states 30, 32 in either well 31, 33 or if the size of wells 31, 33 differ in size only very slightly, then it becomes likely that, at most, only one energy level of the entire first set of quasi-bound states 30 will become aligned with another energy level of the second set 32 at any given bias.

Thus, transport through pairs of unaligned levels will either be energetically inaccessible because an energy level in the first well 31 is below an energy level in the second well, as shown by a first impermissible transition 51 between the first and second dots 24, 25, or statistically improbable because of a lack of available states in the drain 27, as shown by a second impermissible transition 52 between the second dot 25 and the drain 27.

Thus, holes can only pass through the device 1 by tunnelling onto the first quantum dot 24 by a first permitted transition 53, between first and second dots 24, 25 by a second permitted transition 54 and into the drain by a third permitted transition 55.

The device 1 filters the range of hole energies (E) which pass through device 1, namely to linewidth of the first and second aligned energy states $30_1$, $32_1$.

Not only can the device 1 be used as an energy filter for other devices, but also the device 1 itself can serve as a quantum computer with a quiet environment.

Figure 10A:
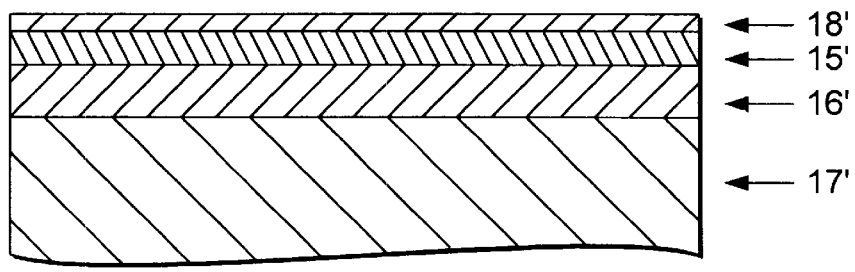
FIGS. 10a and 10b shows a method of fabricating the first device.
Figure 10B:
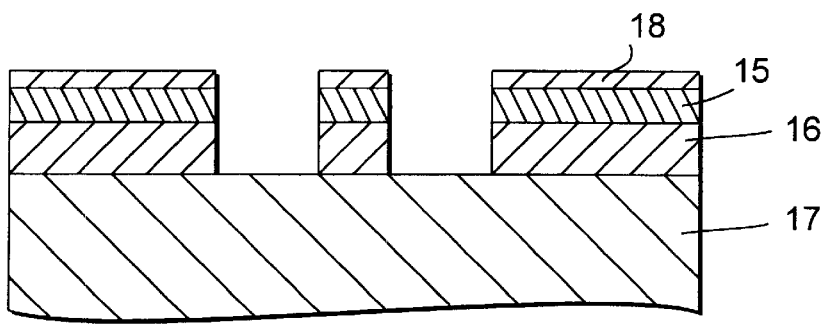

Referring to FIGS. 10a and 10b, a method of fabricating the device 1 will now be described.

An underlying silicon layer 16' is provided on silicon dioxide, by for example implanting oxygen ions into a silicon wafer and annealing. This process forms a buried silicon dioxide layer 17'.

Silicon-germanium 15' is grown on top of the underlying intrinsic silicon layer 16' using low pressure chemical vapour deposition (LPCVD) using $SiH_4$, $B_2H_6$ and $GeH_4$ as feed gases. A capping layer 18' is also grown by LPCVD using $SiH_4$ and $H_2$ as feed gases. The corresponding layer structure is shown in FIG. 10a.

The surface of the capping layer 18' is patterned using conventional optical lithographic techniques and a $CF_4$ reactive ion etch (RIE) is used to remove portions of the capping layer 18', the silicon-germanium layer 15', underlying silicon layer and part of the silicon dioxide layer 17' so as to define a mesa structure (not shown).

The surface of the capping layer 18' is then patterned using conventional electron-beam lithographic techniques and a $CF_4$ reactive ion etch (RIE) is used to remove portions of the capping layer 18', the silicon-germanium layer 15', underlying silicon layer and part of the silicon dioxide layer 17' as to define the channel, source, drain and gate regions 2, 3, 4, 5, 6. The corresponding layer structure is shown in FIG. 10b.

Finally, the surface is patterned using conventional optical lithographic techniques to define aluminium bond pads (not shown) on the large-area portions (not shown) of the source, drain and gate regions 3, 4, 5, 6.

Figure 11:
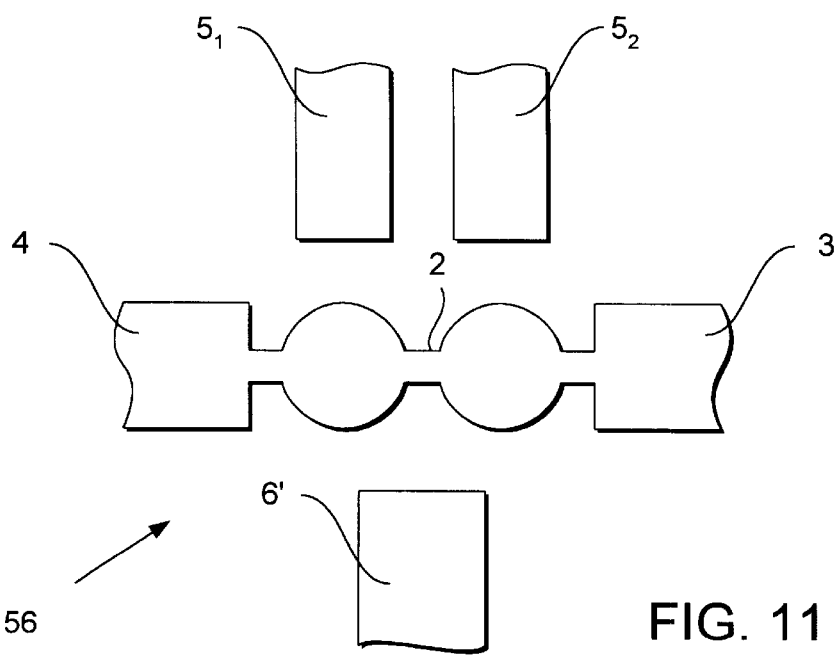
FIG. 11 is a plan view of a second coupled quantum dot device.

Referring to FIG. 11, a second coupled quantum dot device 56 is similar to the first device 1 in that it has a trench-isolated channel region 2 disposed between source and drain regions 3, 4. However, the first gate 5, is split into separately controllable gate regions $5_1$, $5_2$. This allows each wide channel region 10, 11 to be controlled independently. Furthermore, the second gate 6' is shorter than that of the first embodiment. Moreover, all the gates $5_1$, $5_2$, 6' are located closer to the channel 2 than in FIG. 1.

The coupled quantum dot devices 1, 56 described hereinbefore may be modified and used as quantum computers and as noise filters, as will now be described.

Single Qubit System

Figure 12:
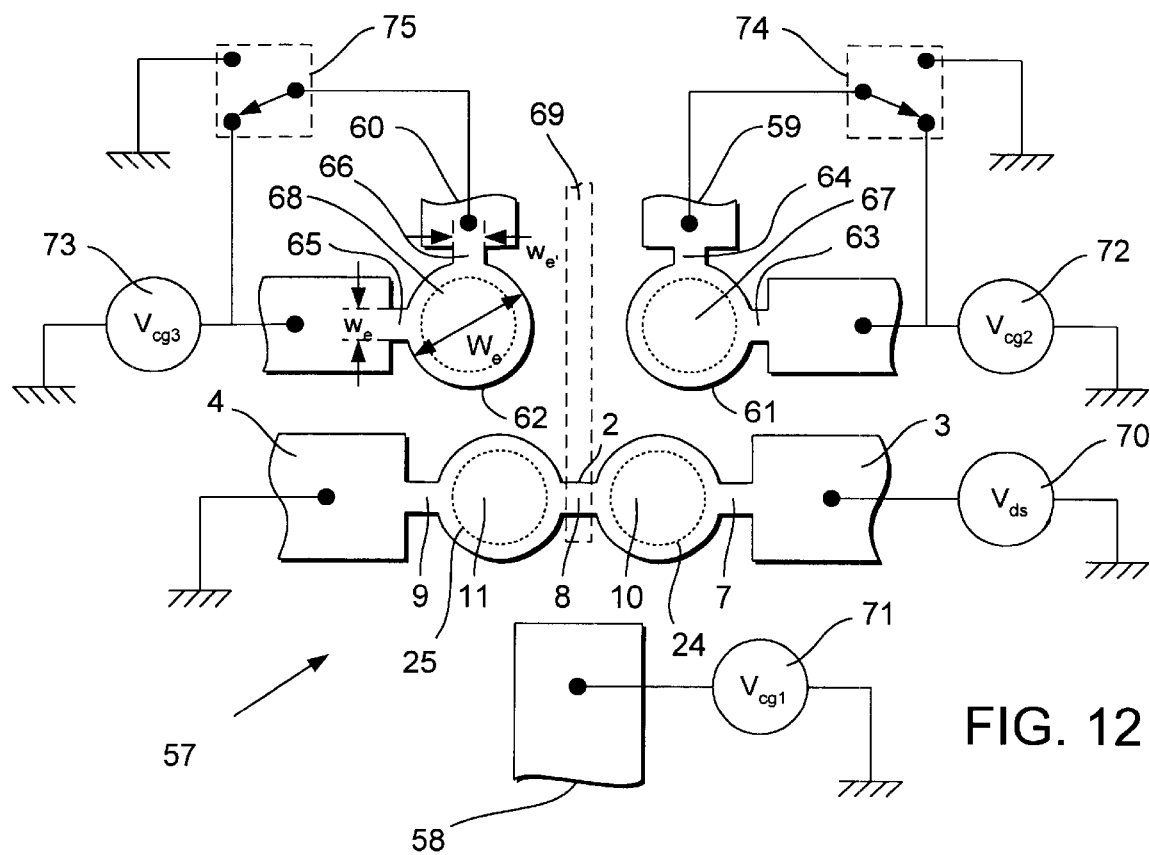
FIG. 12 is a plan view of a single qubit quantum computer comprising a coupled quantum dot device.

Referring to FIG. 12, a single qubit quantum computer 57 comprises a coupled quantum dot device having a trench-isolated channel region 2 disposed between source and drain regions 3, 4 and provided with a first, second and third control gates 58, 59, 60. The first control gate 58 is disposed on one side of the channel region 2 and the second and third control gates 59, 60 are disposed on the other side of the channel region 2. The channel region 2 is "pinched" so as to produce first, second and third narrow channel regions 7, 8, 9. A first wide channel region 10 is formed between the first and second narrow regions 7, 8 and a second channel wide region 11 is defined between the second and third narrow regions 8, 9. The channel region 2 is about 200 nm long between the source and drain regions 3, 4.

The relatively narrow channel regions 7, 8, 9 are 20 nm wide. The first and second wide regions 10, 11 are substantially circular and have diameters of about 60 nm. However, their diameters are not quite equal. As described hereinbefore, the first and second wide channel regions 10, 11 define first and second quantum dots 24, 25.

The second and third control gates 59, 60 each comprise an 'L'-shaped channel region 61, 62 which is pinched so as to form narrow channel regions 63, 64, 65, 66. In each channel region 61, 62, a wide region 67, 68 is formed between corresponding pairs of narrow electrometer channel regions 63, 64, 65, 66 and is positioned at the corner of the 'L'-shaped channel region 61, 62. Each wide region 67, 68 is substantially circular and has a diameter of 60 nm as indicated by arrow $W_e$. The narrow electrometer regions 63, 64, 65, 66 are 20 nm wide as indicated by arrows $w_e$, $w_{e'}$.

The second and third control gates 59, 60 can operate in two modes. In a first mode, they operate as separately controllable gates so as to allow each wide channel region 10, 11 to be controlled independently. In a second mode, they operate as single-electron electrometers which permit detection of charge on each quantum dot 24, 25 formed within the first and second wide regions 10, 11.

A surface gate 69 may be used to provide additional control of the second narrow channel region 8.

A voltage source 70 is used to apply a bias $V_{ds}$ between the source and drain regions 3, 4. A voltage source 71 is used to apply a bias $V_{cg1}$ to the first control gate 58. Voltage sources 72, 73 are used to apply biases $V_{cg2}$ and $V_{cg3}$ to the second and third control gates 59, 60 respectively. Switches 74, 75 are employed to switch the second and third gates 59, 60 between first and second modes. If a surface gate 67 is provided, a voltage source (not shown) is used to apply a bias $V_{sg}$.

The channel, source and drain and the control gate regions 2, 3, 4, 58, 59, 60 are formed in layers of silicon germanium 15 as described hereinbefore.

The optional surface gate 69 comprises a metal layer (not shown), such as aluminium overlying the capping silicon layer 18 (FIG. 2), sidewalls 19 (FIG. 2) and the silicon dioxide substrate 17 (FIG. 2). A dielectric layer, such as silicon dioxide or silicon nitride, may be additionally provided between the metal layer and the capping layer 18 so as to reduce gate capacitance and gate leakage.

The coupled-quantum dot device 57 is suitable for carrying out quantum computation on a qubit. The tunnel barriers 21, 22, 23 formed in the narrow channel regions 7, 8, 9 are used to confine an excess hole to the first quantum dot 24 or the second quantum dot 25. This provides a two-state system. Basis states may be defined as:

|0>≡|excess hole on the second quantum dot 25>
|1>≡|excess hole on the first quantum dot 24>

Moreover, the configuration of the first and second quantum dots 24, 25 between first, second and third tunnel barriers 21, 22, 23 provides a quiet electromagnetic environment which makes the system particularly suitable for carrying out quantum computation. When the system is sufficiently cooled, for example to 20 mK, a qubit may be prepared as a superposition of quantum states using the first and second quantum dots 24, 25. The quantum states remain coherent long enough so as to permit manipulation of the qubit.

A process by which a qubit is prepared and manipulated will now be described:

Firstly, an initial state, for example $|\psi_i>=|0>$, is prepared. This comprises applying a small source-drain bias $V_{ds}$, while some or all of the first, second and third control gates 58, 59, 60 are swept so as to cause an excess hole to appear on the second quantum dot 25. Appropriate values of applied biases, $V_{ds}$, $V_{cg1}$, $V_{cg2}$, $V_{cg3}$ are found by routine experimental methods, for example by examining an $I_{ds}$-$V_{cg}$ stability diagram for the device 57. Biases to the first, second and third control gates 58, 59, 60 and the source-drain bias are removed so as to cause the barrier heights of the first, second and third tunnel barriers 21, 22, 23 to rise, thereby isolating the first and second quantum dots from the source and drain regions 3, 4 and leaving the system in the state |0>.

Secondly, a unitary transformation $U_t$ of the initial state is performed. This comprises applying a pulse to the first control gate 58 or to the surface gate 67 for a predetermined time t so as to lower the barrier height of the second tunnel barrier 22 formed by the second narrow channel region 8 and thereby permit charge tunnelling between the first and second quantum dots 24, 25. This transforms the initial state |0> into a final state $|\psi_f>$ consisting of mixture of states |0> and |1>.

Finally, a measurement of the final state $|\psi_f>$ is carried out. This comprises using the second control gate 59 as an electrometer. A current-voltage $I_{cg2}$-$V_{cg2}$ characteristic is obtained for the second control gate 59. The characteristic exhibits a Coulomb gap, the size of which depends on any offset charge. The offset charge includes a contribution due to any excess charge on the first quantum dot 24. Thus, the presence or absence of excess charge on the first quantum dot 24 can be determined. Alternatively or additionally, the third control gate 60 may be used to detect charge on the second quantum dot 25. Although only one measurement by single electrometer is needed to determine which of the two quantum dots 24, 25 stores the excess charge, it is advantageous to take two measurements using two electrometers since their respective results should be anticorrelated.

The first and second steps are then repeated N-times, using the same predetermined time t. The measurements are used to obtain a statistical mixture of $|0>^S$ and $|1>^S$ and so determine the effect of the transformation $U_t$. If the number of measurements which return 0 is $n_0$ and the number of measurements which return 1 is $n_1$, then the transformation $U_t$ of the initial state $|0>$ is estimated to be:

$$U_t|0\rangle \rightarrow \sqrt{\frac{n_0}{N}}\left|0\right\rangle + e^{i\theta}\sqrt{\frac{n_1}{N}}\left|1\right\rangle$$

where $e^{i\theta}$ is a phase term. The phase term alters the charge distribution between the quantum dots 24, 25. The charge distribution may be determined, for example using additional measurements employing the second and third control gates 59, 60 as electrometers. However, the measurement is carried out while the second tunnel barrier 22 is lowered.

For example, the orthogonal states $2^{-\frac{1}{2}}(|0>+|1>)$ and $2^{-\frac{1}{2}}(|0>-|1>)$ differ by a relative phase $e^{i\pi}$. The former has a symmetric wavefunction which is non-zero at a mid-point between the quantum dots 24, 25. The latter has an anti-symmetric wavefunction which is zero at the mid-point. Thus, the symmetric and antisymmetric wavefunctions may be distinguished by determining the charge distribution at the mid-point between the quantum dots 24, 25.

Thus, the coupled quantum dot device 57 may be used to determine what period of time t is needed to effect a so-called Hadamard Transformation, $U_H$, in which $|0>$ is transformed into an equal superposition of $|0>$ and $|1>$, i.e. $2^{-\frac{1}{2}}(|0>+|1>)$. The Hadamard Transform $U_H$ is a unitary transformation commonly used quantum algorithms, such that:

$U_H|0>=2^{-\frac{1}{2}}(|0>+|1>)$ $U_H|1>=2^{-\frac{1}{2}}(|0>-|1>)$

For example, Hadamard Transform $U_H$ can be used to define new basis states:

$|0'>=2^{-\frac{1}{2}}(|0>+|1>)$ $|1'>=2^{-\frac{1}{2}}(|0>-|1>)$

This represents a 45° rotation of the initial state in Hilbert space. Of course different timed pulses can be used to rotate the initial state by different degrees.

Multiple Qubit System

Figure 13:
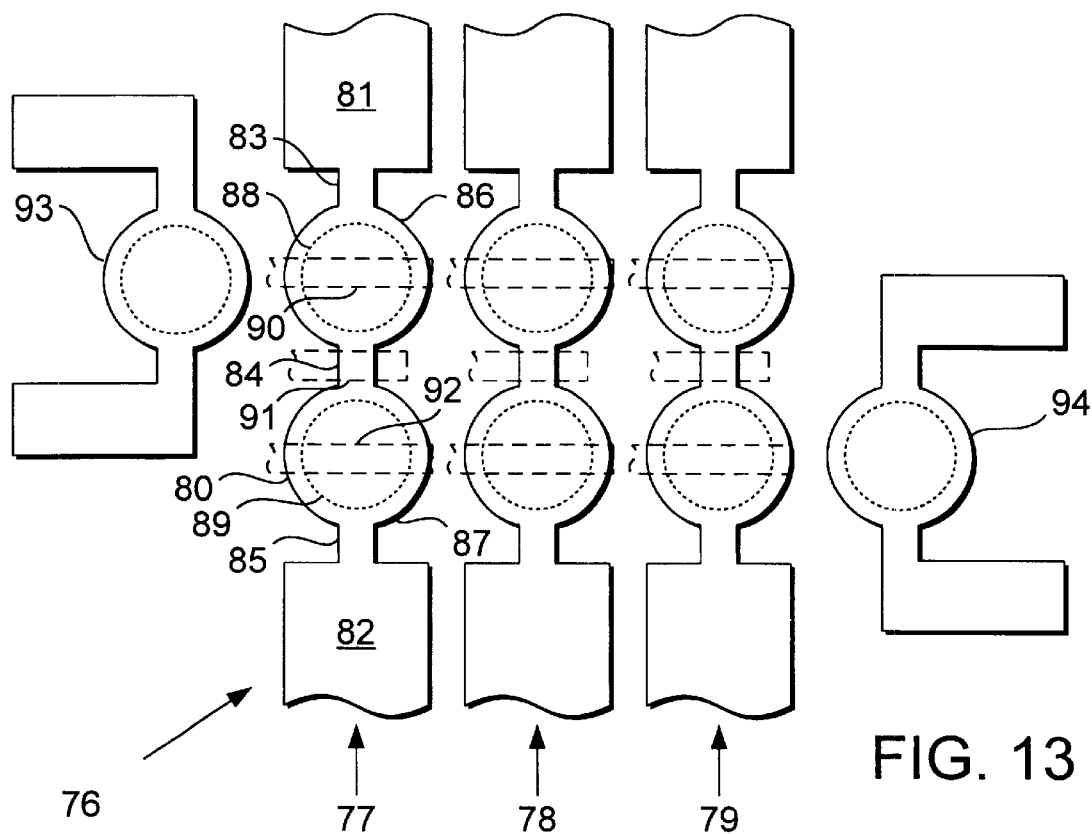
FIG. 13 is a plan view of a three qubit quantum computer comprising an array of coupled quantum dot units.

Referring to FIG. 13, a 3-qubit quantum computer 76 comprises an array of three coupled quantum dot units 77, 78, 79.

Each quantum dot unit 77, 78, 79 comprises a channel region 80 disposed between source 81 and drain regions 82. Each channel region comprises first, second and third narrow channel regions 83, 84, 85 which define first, second and third tunnel barriers (not shown). Each channel region further comprises first and second wide channel regions 86, 87 which define first and second quantum dots 88, 89. The first and second wide channel regions 81, 82 of the channels 80 have slightly different diameters. First, second and third surface gates 90, 91, 92 are provided. The second surface gate 91 is used to vary barrier heights of the second, interdot, tunnel barrier. The first and third surface gates 90, 92 are arranged over the wide channel regions 86, 87 so as to raise and lower the potential energy of the quantum dots 88, 89.

First and second single quantum dot electrometers 93, 94 are also provided for measurement of the system. The first electrometer 93 is configured to measure the first quantum dot 88 of the first quantum dot unit 77 and the second quantum dot 89 of the third quantum dot unit 79.

The 3-bit quantum computer 76 is fabricated using a silicon-germanium layer using trench isolation as hereinbefore described.

In this example, the quantum dots 88, 89 are sufficiently close to each other that their states are entangled. However, it will be appreciated that they need not be entangled. Preferably, each pair of quantum dots 88, 89 is separated from a neighbouring pair 88, 89 by less than 100 nm. Thus, the 3-qubit quantum computer 76 can store up to 8 numbers simultaneously, as will now be described.

Each coupled quantum dot unit 77, 78, 79 defines a qubit, labelled A, B and C respectively. Each qubit is prepared in a $|0>$ state in a manner hereinbefore described. The Hadamard transform $U_H$ is performed by application of an appropriately timed pulse to each second surface gate 90 as previously described.

Thus, each state is transformed from $|0>$ to $2^{-\frac{1}{2}}(|0>+|1>)$. Therefore, the overall state of the system is:

$$|\Psi\rangle_{ABC} = 8^{-1/2}(|0\rangle_A + |1\rangle_A)(|0\rangle_B + |1\rangle_B)(|0\rangle_C + |1\rangle_C)$$

$$= 8^{-1/2}(|000\rangle + |001\rangle + |010\rangle + |011\rangle + |100\rangle +$$

$$|101\rangle + |110\rangle + |111\rangle)$$

where $|XXX>$ means $|X_A X_B X_C>$.

As hereinbefore described, each qubit can be transformed by application of pulses to the second, interdot, surface gate 91. However, a transformation of a qubit, such as qubit A, may also be conditional on the state of a neighbouring qubit, in this case qubit B. The dipole moment of neighbouring qubit B will alter the energy of states of the qubit A.

A global, time-dependent electric field may be applied to the quantum computer 76 using a surface gate, a laser or a microwave cavity (not shown) to control which qubits undergo a transformation.

Figures 14A, 14B:
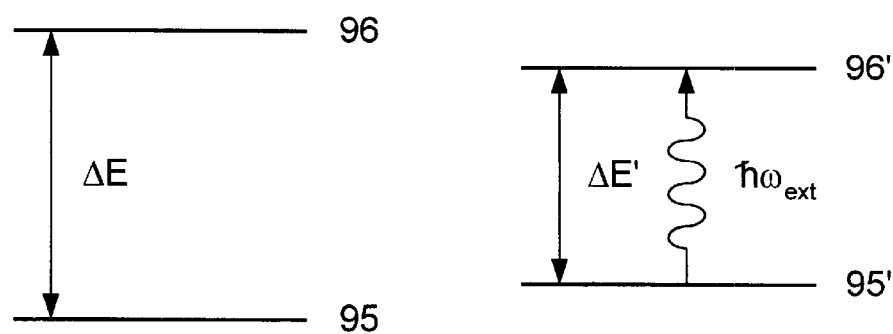
FIG. 14a is a schematic view of wavefunction energy states without an applied gate bias.
FIG. 14b is a schematic view of wavefunction energy states with an applied gate bias.

Referring to FIGS. 14*a* and 14*b*, first and second states 95, 96, for example $|0>$ and $|1>$ or $|0'>$ and $|1'>$, are separated by an energy gap $\Delta E$ which may arise due to the difference in size of the quantum dots 24, 25 and/or the degree of coupling between them. The energy gap $\Delta E$ corresponds to an excitation energy $\hbar\omega$, where $\hbar$ is the Dirac constant and $\omega$ is the frequency of the excitation.

If a global field is applied at a frequency $\omega_{ext}$ such that $\omega \neq \omega_{ext}$, then it will have substantially no effect on the states 95, 96. However, if a gate bias is applied, for example so as to alter the energy difference $\Delta E \rightarrow \Delta E' = \hbar\omega'$ such that $\omega' = \omega_{ext}$, then the system will undergo Rabi oscillations between altered first and second states 95', 9'6. The corresponding energy levels of the altered states 95', 96' are shown in FIG. 14*b*.

Referring again to FIG. 13, there is an energy gap $\Delta E_{(0\rightarrow 1)}$ between $|0>$ and $|1>$ state for the first, second and third quantum dot units 77, 78, 79 which define qubits A, B and C respectively. Application of a global, time dependent field at a frequency $\omega_{ext}$ has no effect on the qubits. However, if a pulse is applied to the first gate 90 of the first quantum dot unit 77 so as to bring qubit A into resonance with the field, then qubit A will undergo Rabi oscillations between the |0> and |1> states. By choosing an appropriate length of pulse, qubit A can be transformed from the |0> to the |1> state, while the other two qubits, B and C, are left unchanged.

Thus, the quantum computer 76 can be set up in any initial state using a global field and control gates 90, 91, 92 for each quantum dot unit 77, 78, 79.

It will be appreciated that the 3-qubit system described hereinbefore may be extended to an n-qubit system, comprising n-coupled quantum dot units.

It will also be appreciated that other modifications may be made to the 3-qubit computer. For example, some or all of the quantum dots 88, 89 may be provided with its own electrometer. For example, this may be achieved by providing a second silicon-germanium layer and fabricating a single quantum dot electrometer beneath or above a respective quantum dot 88, 89 of the coupled quantum dot units 77, 78, 79.

2-Qubit CNOT Gate

A 2-qubit system can be used as a controlled-NOT (CNOT) gate which performs an operation $U_{CNOT}$. The 2-qubit system may be made by modifying the 3-qubit system described earlier by removing the third quantum dot unit 79. Alternatively, the 3-qubit system can be used as a 2-qubit system by simply using only the first and second quantum dot units 77, 78.

The first quantum dot unit 77 defines a target qubit denoted T, while the second quantum dot unit 78 defines a control qubit C. If the control qubit C is in state |1>, then the state of the target qubit T is flipped, otherwise if the control qubit C is in state |0>, then the state of the target qubit is left unchanged. Thus, the effect of the operation $U_{CNOT}$ is:

$$U_{CNOT}|0>_C|0>_T = |0>_C|0>_T$$

$$U_{CNOT}|0>_C|1>_T = |0>_C|1>_T$$

$$U_{CNOT}|1>_C|0>_T = |1>_C|1>_T$$

$$U_{CNOT}|1>_C|1>_T = |1>_C|0>_T$$

The state of the control qubit C does not change when performing the $U_{CNOT}$ operation. Furthermore, repeating the operation returns the target bit T to its original state.

Figure 15:
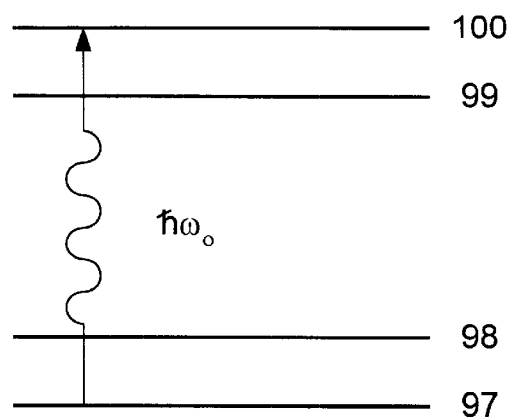
FIG. 15 is a schematic view of CNOT gate operation.

Referring to FIG. 15, $|1>_C|0>_T$, $|0>_C|0>_T$, $|0>_C|1>_T$ and $|1>_C|1>_T$ states 97, 98, 99, 100 are shown. As explained earlier, the first and second quantum dot units 77, 78 are sufficiently close that they electrostatically interact. Because of this, the "parallel" state $|0>_C|0>_T$ 98 has a higher energy than the "antiparallel" state $|1>_C|0>_T$ 97.

The CNOT gate operates using a global field in a manner similar to that described hereinbefore. A pulse of radiation having a frequency $\omega_o$ is applied which is tuned to the transition between $|1>_C|0>_T$ and $|1>_C|1>_T$ states 97, 100. When the control qubit C is set to $|1>_C$, the system will undergo Rabi oscillations between the $|1>_C|0>_T$ and $|1>_C|1>_T$ states 97, 100. Thus, an appropriately timed pulse will cause the target bit T to flip from $|0>_T$ to $|1>_T$ or vice versa. However, when the control qubit C is set to $|0>_C$ the system will not undergo a transition because the energy gap is off-resonance.

It will be appreciated that the duration of the pulse and the frequency of the excitation can be determined using routine experimental methods.

Although CNOT operation has been described with reference to basis states |0> and |1>, it will be appreciated that the conjugate basis states |0'> and |1'> could also be used.

Quantum Algorithms

The coupled quantum dot devices described hereinbefore can perform $U_H$ and $U_{CNOT}$ operations and also arbitrary qubit rotations. Therefore, any unitary transform U can be synthesised using these operations.

Unitary operations are used to construct quantum algorithms. One such algorithm is Grover's Searching Algorithm and is described on pages 166–171 of "Introduction to Quantum Computation and Information" ibid. The algorithm uses the Hadamard transform $U_H$ and two other operators $U_{C^v}$ and $U_{C0}$, such that $$U_{C^v}|v> = -|v>$$

$$U_{C^v}|x> = |x> x \neq v$$

$$U_{C0}|0> = -|0>$$

$$U_{C0}|x> = |x> x \neq 0$$

Those skilled in the art will appreciate that the $U_{C^v}$ and $U_{C0}$ operators can be built up from a succession of 2-qubit CNOT operations and arbitrary single-qubit rotations.

Quantum Cellular Automata Device

Figure 16:
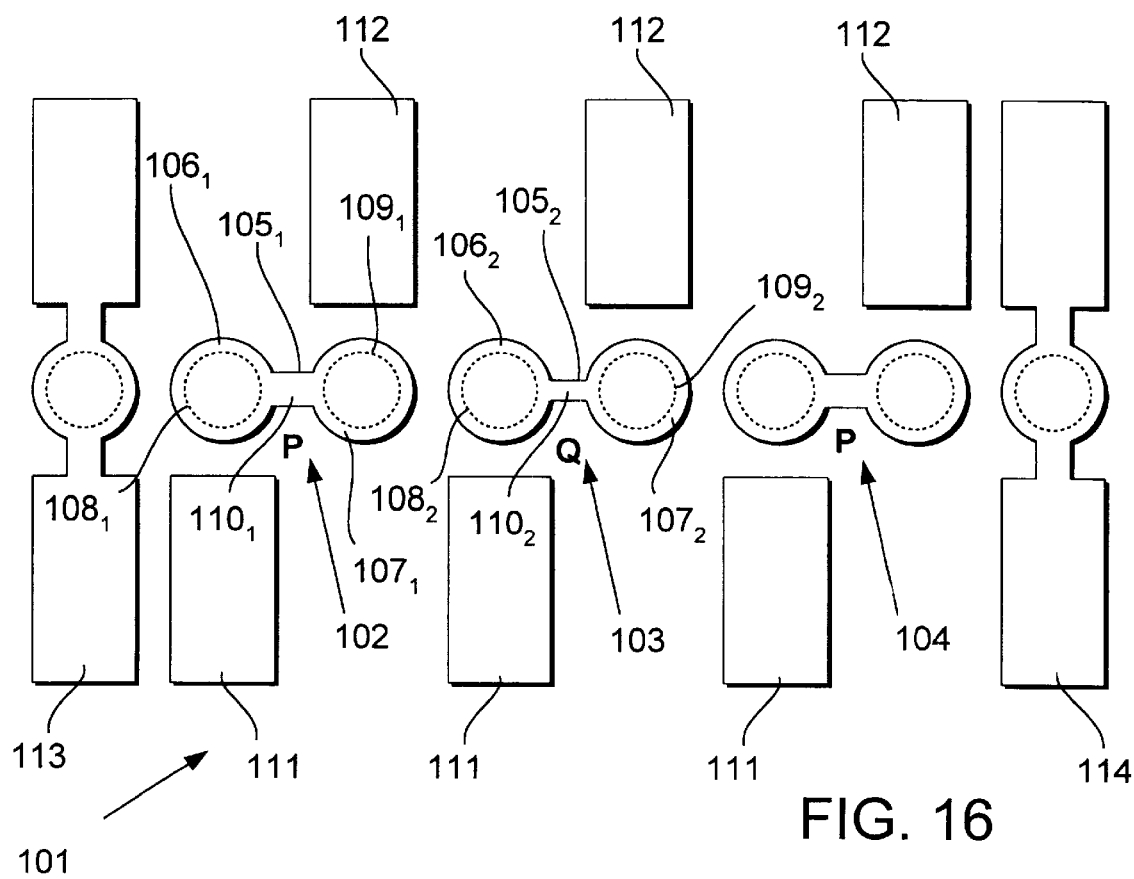
FIG. 16 is a plan view of a quantum cellular automata device comprising an array of coupled quantum dot units.

Referring to FIG. 16, a quantum computer 101 is based on a quantum cellular automata type scheme such as that described in "Schemes for parallel quantum computation without local control of qubits" by S. C. Benjamin, Physical Review A, Volume 61, p. 020301(2000).

The quantum computer 101 comprises a one-dimensional array of coupled quantum dot units 102, 103, 104 arranged end-to-end. Each quantum dot unit 102, 103, 104 comprises a dumbbell-shaped channel 105 with first and second lobe regions 106, 107 which define first and second quantum dots 108, 109 and a connecting region 110 which defines an interdot tunnel barrier (not shown). The first and second lobe regions 106, 107 have slightly different sizes. The connecting region $110_1$ of the first quantum dot unit 108 is arranged to be relatively wide, while the connecting region $110_2$ of the second quantum dot unit 109 is arranged to be relatively narrow. The size of the connecting region 110 alternates for each coupled quantum dot unit along the array between being relatively wide and being relatively narrow. These connecting regions 110 are designated type 'P' and 'Q' respectively. Each quantum dot unit 102, 103, 104 is provided with first and second electrodes 111, 112. The electrodes have a dual purpose. Firstly, they serve as source and drain regions respectively used to prepare an initial state. Secondly, each pair of electrodes 111, 112 operate as gates for applying electric fields which alter the energy of states within the quantum dots. First and second electrometers 113, 114 are disposed at each end of the one-dimensional array.

The quantum computer 101 is fabricated using a silicon-germanium layer using trench isolation as hereinbefore described.

Each pair of quantum dots 108, 109 is a two-level system. In this case, the basis states |0'> and |1'> are chosen which define $2^{-1/2}(|0>+|1>)$ and $2^{-1/2}(|0>-|1>)$ states respectively. These are symmetric and antisymmetric superpositions of states |0> and |1>. The energy separation between the two energy levels of each pair of quantum dots 108, 109 differs according to the size of the interdot tunnel barrier, i.e. depending on whether they are type 'P' or 'Q'.

A global pulse, as described earlier, can be applied, for example using a microwave source and a waveguide feed, which will effect a transformation in quantum dots 108, 109 coupled by a type 'P' tunnel barrier, such as the quantum dots 108, 109 of the first and third quantum dot units 102, 104, without affecting quantum dots 108, 109 coupled by a type 'Q' tunnel barrier, in this case the quantum dots of the second quantum dot unit 103 and vice versa.

Noise Filter

Figure 17:
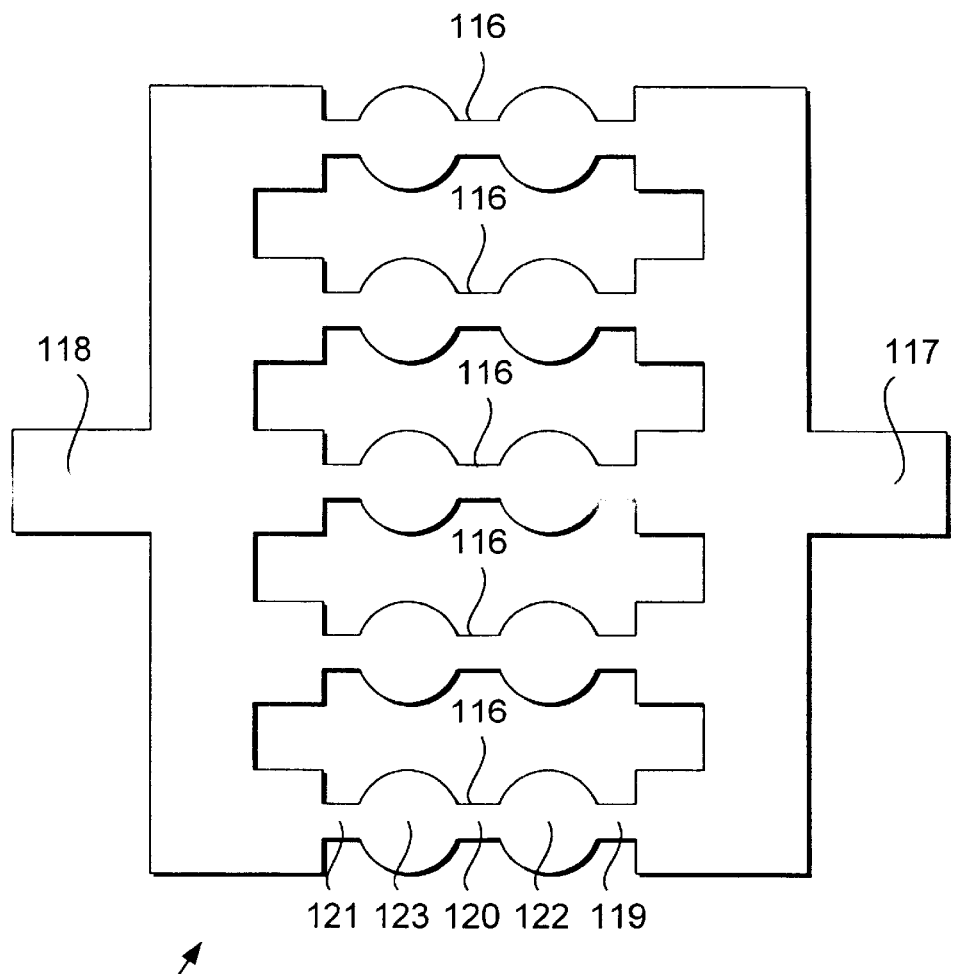
FIG. 17 is a plan view of a noise filter comprising a plurality of quantum dot pairs in parallel.

Referring to FIG. 17, a noise filter 115 comprises a plurality of channel regions 116 arranged in parallel between a common source region 117 and a common drain region 118. Each channel region 116 is "pinched" so as to produce respective first, second and third narrow channel regions 119, 120, 121. First and second wide channel regions 122, 123 are formed between the narrow regions 119, 120, 121. The provision of a plurality of channel regions 116 allows the filter 115 to conduct larger currents than a single channel device.

The filter 115 is fabricated using a silicon-germanium layer using trench isolation as hereinbefore described.

Figure 18:
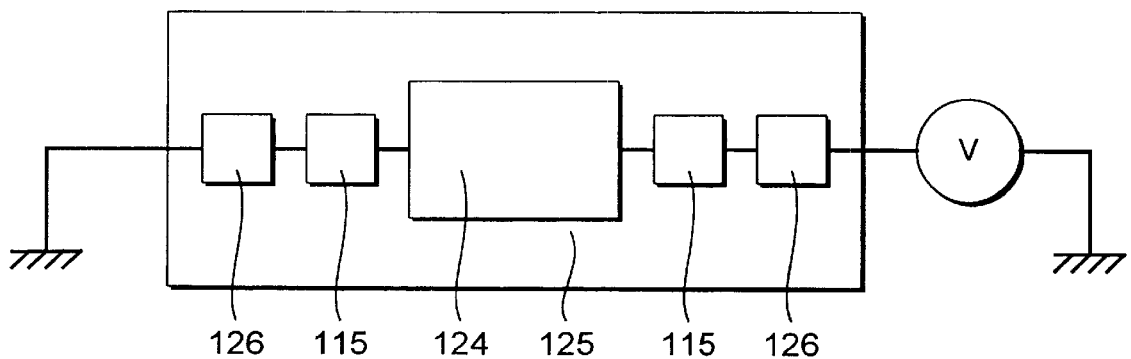
FIG. 18 is a schematic view of a filter in use with an electronic device.

Referring to FIG. 18, a pair of filters 115 is used to isolate an electronic device 124 from noise. To minimise thermal noise, the device 124 may be cooled to milliKelvin temperatures, for example using a dilution refrigerator 125. Electromagnetic shielding, such as a Faraday cage, may be used. The filters 115 may be used in conjunction with conventional noise filters 126, such as copper powder filters.

It will be appreciated that many modifications may be made to the embodiments hereinbefore described. For example, delta-doped gallium arsenide may be used.

What is claimed is:

1. A quantum computer for transforming a first state into a second state comprising:
    a first quantum dot;
    a second quantum dot;
    said first and second quantum dots being spaced apart and arranged so as to define first and second basis states of a quantum bit;
    gate electrodes for preparing said first state as a superposition of said first and second basis states; and
    gate electrodes for controlling coupling between said first and second quantum dots so as to transform said first state into said second state.

2. A quantum computer according to claim 1, wherein said first basis state is defined by a first given charge distribution across said first and second quantum dots.

3. A quantum computer according to claim 2, wherein said second basis state is defined by a second given charge distribution across said first and second quantum dots.

4. A quantum computer according to claim 1, wherein said first basis state is defined by a given amount of excess charge on said first quantum dot relative to said second quantum dot.

5. A quantum computer according to claim 1, wherein said second basis state is defined by a given amount of excess charge on said second quantum dot with respect to said first quantum dot.

6. A quantum computer according to claim 1, wherein said gate electrodes for controlling coupling between said first and second quantum dots comprises an electrode for adjusting a tunnel barrier disposed between said first and second quantum dots.

7. A quantum computer according to claim 1, wherein the first and the second quantum dots are of unequal size.

8. A quantum computer according to claim 1 comprising a conductive channel region between source and drain regions.

9. A quantum computer according to claim 8, wherein the conductive channel region is substantially planar.

10. A quantum computer according to claim 8, wherein a first portion of the conductive channel region is configured so as to define a first tunnel barrier.

11. A quantum computer according to claim 10, wherein a second portion of the conductive channel region is configured so as to define a second tunnel barrier.

12. A quantum computer according to claim 11, wherein a third portion of the conductive channel region is configured so as to define a second tunnel barrier.

13. A quantum computer according to claim 8, wherein the conductive channel region comprises a semiconductor.

14. A quantum computer according to claim 13, wherein the semiconductor is silicon-germanium.

15. A quantum computer according to claim 13, wherein the semiconductor is doped with an impurity.

16. A quantum computer according to claim 15, wherein the impurity concentration is at least $1 \times 10^{19}$ cm$^{-3}$.

17. A quantum computer according to claim 15, wherein the impurity is an acceptor.

18. A quantum computer according to claim 17, wherein the impurity is boron.

19. A quantum computer according to claim 8, wherein the conductive channel region is isolated by at least one trench.

20. A quantum computer according to claim 1, wherein said first and second quantum dots are configured so as to exhibit Coulomb blockade.

21. A quantum computer according to claim 1 comprising a sensor for measuring charge on at least one of said first and second quantum dots.

22. A quantum computer according to claim 21 comprising sensors for measuring charge on each of said first and second quantum dots.

23. A quantum computer according to claim 21, wherein said sensor for measuring charge comprises a single-electron electrometer.

24. Apparatus including a quantum computer according to claim 1 and a source for providing a time dependant electric field to said quantum computer.

25. Apparatus according to claim 24, wherein said source is a laser.

26. Apparatus according to claim 24, wherein said source is a gate electrode.

27. Apparatus according to claim 24, wherein said source generates microwaves.

28. Apparatus including a quantum computer according to claim 1 and control circuitry for controlling said gate electrodes.

29. Apparatus including a quantum computer according to claim 1 and a refrigerator for cooling said quantum computer.

30. A quantum computer for transforming a first state into a second state comprising:
    an array of elements, each element of the array comprising:
    a first quantum dot;
    a second quantum dot;
    said first and second quantum dots being spaced apart and arranged so as to define first and second basis states of a quantum bit
    gate electrodes for preparing a quantum bit state as a superposition of said first and second basis states;
    said elements being arranged so as to cause entanglement of the quantum bits of said elements of said array;
    gate electrodes for preparing said first state as an entangled superposition of quantum bit states and
    gate electrodes for controlling coupling between first and second quantum dots of at least one element so as to transform said first state into said second state.

31. Apparatus including a quantum computer according to claim 30 and a source for providing a time dependant electric field to said quantum computer.

32. Apparatus including a quantum computer according to claim 30 and a control circuitry for controlling said gate electrodes.

33. Apparatus including a quantum computer according to claim 30 and a refrigerator for cooling said quantum computer.

34. A method of operating a quantum computer comprising a first quantum dot, a second quantum dot, said first and second quantum dots being spaced apart and arranged so as to define first and second basis states, the method comprising:

preparing a first state as a superposition of said first and second basis states and controlling coupling between said first and second quantum dots so as to transform said first state into a second state.

35. A method according to claim 34, wherein said controlling coupling between said first and second quantum dots comprises lowering a tunnel junction disposed between said first and second quantum dots for a predetermined period of time.

36. A method according to claim 34, comprises providing an excitation so as to cause Rabi oscillations between said first and second states.

37. A quantum computer for transforming a first state into a second state comprising:

a structure for defining a first quantum dot;

a structure for defining a second quantum dot;

said structures for defining said first and second quantum dots being spaced apart and arranged so as to define first and second basis states of a quantum bit;

gate electrodes for preparing said first state as a superposition of said first and second basis states; and gate electrodes for controlling coupling between said first and second quantum dots so as to transform said first state into said second state.

38. An electronic device comprising:

a channel for charge carriers;

a source for providing charge carriers to said channel with a first range of charge carrier energy, said channel comprising:

a first quantum dot with a first set of energy levels;

a second quantum dot with a second set of energy levels having different level spacing from the first set;

wherein the first range of charge carrier energy is greater than the spacing between a pair of adjacent energy levels of the first quantum dot and that charge carrier transport through the device only takes place through a one of the first set of energy levels and a one of the second set of energy levels which are energetically aligned.

* * * * *